US011018097B2

(12) United States Patent
Zhu et al.

(10) Patent No.: US 11,018,097 B2
(45) Date of Patent: May 25, 2021

(54) ELECTRONIC COMPONENT GUARD RING

(71) Applicant: Intel Corporation, Santa Clara, CA (US)

(72) Inventors: Hongbin Zhu, Boise, ID (US); Minsoo Lee, Boise, ID (US); Gordon A. Haller, Boise, ID (US); Philip J. Ireland, Nampa, ID (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/707,188

(22) Filed: Dec. 9, 2019

(65) Prior Publication Data

US 2020/0194385 A1 Jun. 18, 2020

Related U.S. Application Data

(63) Continuation of application No. 15/283,327, filed on Oct. 1, 2016, now Pat. No. 10,504,859.

(51) Int. Cl.

| | |
|---|---|
| ***H01L 23/58*** | (2006.01) |
| ***H01L 23/532*** | (2006.01) |
| ***H01L 21/3065*** | (2006.01) |
| ***H01L 21/3205*** | (2006.01) |
| ***H01L 23/00*** | (2006.01) |

(52) U.S. Cl.

CPC ........ *H01L 23/585* (2013.01); *H01L 21/3065* (2013.01); *H01L 21/32051* (2013.01); *H01L 23/53271* (2013.01); *H01L 23/562* (2013.01); *H01L 2924/1432* (2013.01); *H01L 2924/1434* (2013.01); *H01L 2924/3512* (2013.01)

(58) Field of Classification Search

CPC . H01L 23/585; H01L 27/11551–11556; H01L 27/11578–11582; H01L 23/562

See application file for complete search history.

(56) References Cited

U.S. PATENT DOCUMENTS

| | | | |
|---|---|---|---|
| 9,455,261 | B1 | 9/2016 | Sun et al. |
| 2006/0220250 | A1 | 10/2006 | Kim et al. |
| 2009/0096104 | A1 | 4/2009 | Lee et al. |
| 2009/0140370 | A1 | 6/2009 | Jou et al. |
| 2009/0140391 | A1 | 6/2009 | Hou et al. |
| 2011/0057297 | A1 | 3/2011 | Lee et al. |
| 2011/0193197 | A1 | 8/2011 | Farooq et al. |
| 2012/0241917 | A1 | 9/2012 | Ide et al. |
| 2012/0319296 | A1 | 12/2012 | Tsumura et al. |
| 2016/0268166 | A1 | 9/2016 | Nakajima |

OTHER PUBLICATIONS

Advisory Action for U.S. Appl. No. 15/283,327, dated Jun. 26, 2018, 3 pages.

(Continued)

*Primary Examiner* — Stephen M Bradley

(74) *Attorney, Agent, or Firm* — Compass IP Law, PC

(57) ABSTRACT

Guard ring technology is disclosed. In one example, an electronic component guard ring can include a barrier having a first barrier portion and a second barrier portion oriented end to end to block ion diffusion and crack propagation in an electronic component. The guard ring can also include an opening in the barrier between the first and second barrier portions extending between a first side and a second side of the barrier. Associated systems and methods are also disclosed.

20 Claims, 6 Drawing Sheets

630a 630b 642 602 643 644 640

(56) References Cited

OTHER PUBLICATIONS

Final Office Action for U.S. Appl. No. 15/283,327, dated Mar. 11, 2019, 8 pages.
Final Office Action for U.S. Appl. No. 15/283,327, dated Feb. 20, 2018, 6 pages.
First Office Action for U.S. Appl. No. 15/283,327, dated Aug. 10, 2017, 7 pages.
International search report dated Dec. 15, 2017, in International Application No. PCT/US2017/049996, filed Sep. 4, 2017; 15 pages.
Restriction Requirement for U.S. Appl. No. 15/283,327, dated May 17, 2017, 5 pages.
Second Office Action for U.S. Appl. No. 15/283,327, dated Oct. 18, 2018, 7 pages.

ELECTRONIC COMPONENT GUARD RING

PRIORITY DATA

This application is a continuation of U.S. patent application Ser. No. 15/283,327, filed Oct. 1, 2016, now issued as U.S. Pat. No. 10,504,859, which is incorporated herein by reference.

TECHNICAL FIELD

Embodiments described herein relate generally to protection of electronic components, and more particularly to guard rings formed in semiconductor material about electronic components.

BACKGROUND

The peripheries of semiconductor chips are exposed to physical device damage, undesirable moisture, and ionic contaminants. Accordingly, a "guard ring," also known as a "seal ring," typically formed of a metal band, is often located around the periphery of each chip as part of the fabrication of the IC dice prior to dice singulation via laser dicing, sawing, or combinations of these. These guard rings can provide structural reinforcement and stop undesirable cracks, moisture and mobile ionic contaminants from entering active circuitry regions of the chips and affecting operational reliability.

BRIEF DESCRIPTION OF THE DRAWINGS

Invention embodiment features and advantages will be apparent from the detailed description which follows, taken in conjunction with the accompanying drawings, which together illustrate, by way of example, various invention embodiments; and, wherein.

Figure 1:
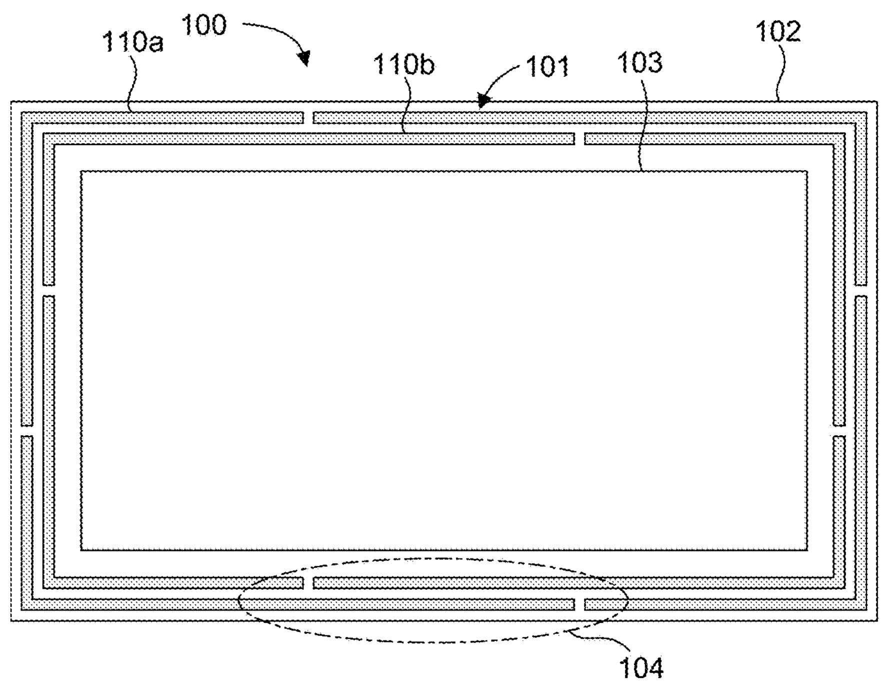
FIG. 1 illustrates a schematic representation of an electronic component in accordance with an example.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used.

As used herein, comparative terms such as "increased," "decreased," "better," "worse," "higher," "lower," "enhanced," "maximized," and "minimized," and the like refer to a property of a device, component, or activity that is measurably different from other comparable devices, components, or activities, or from different iterations or embodiments of the same device, properties in the known state of the art. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment. Occurrences of the phrase "in one embodiment," or "in one aspect," herein do not necessarily all refer to the same embodiment or aspect.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

EXAMPLE EMBODIMENTS

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

Some electronic components (e.g., NAND flash memory devices) include materials and structures (e.g., layers of conductive material) that can build up electrical charges and arc during formation of a trench for the construction of a guard ring. Such arcing can be detrimental to electronic components.

Accordingly, an electronic component guard ring is disclosed in which the guard ring structure is such that build-up of electrical charges and arcing is minimized during construction while still providing the desired functions of a guard ring. In one aspect, electrical charge is dissipated through connecting bridges of material to minimize arcing potential. In one example, an electronic component guard ring can include a barrier having a first barrier portion and a second barrier portion oriented end to end to block ion diffusion and crack propagation in an electronic component. The guard ring can also include an opening in the barrier between the first and second barrier portions extending between a first side and a second side of the barrier. Associated systems and methods are also disclosed.

Referring to FIG. 1, an exemplary electronic component 100 is illustrated. In general, the electronic component 100 can include a semiconductor material 102 and a guard ring 101. Typically, electronic circuitry 103 will be associated with the semiconductor material 102. In some embodiments, the semiconductor material 102 can be configured as a substrate. The guard ring 101 can be incorporated for a variety of purposes, such as to provide mechanical benefits to the electronic component 100 and/or to provide a contamination barrier to protect the circuitry 103. For example, the guard ring 101 can be configured to prevent crack propagation (e.g., from die-sawing stress) and/or prevent contaminants from entering the electronic circuits 103 of the electronic component 100 (e.g., moisture, ion diffusion, etc.).

Figure 2:
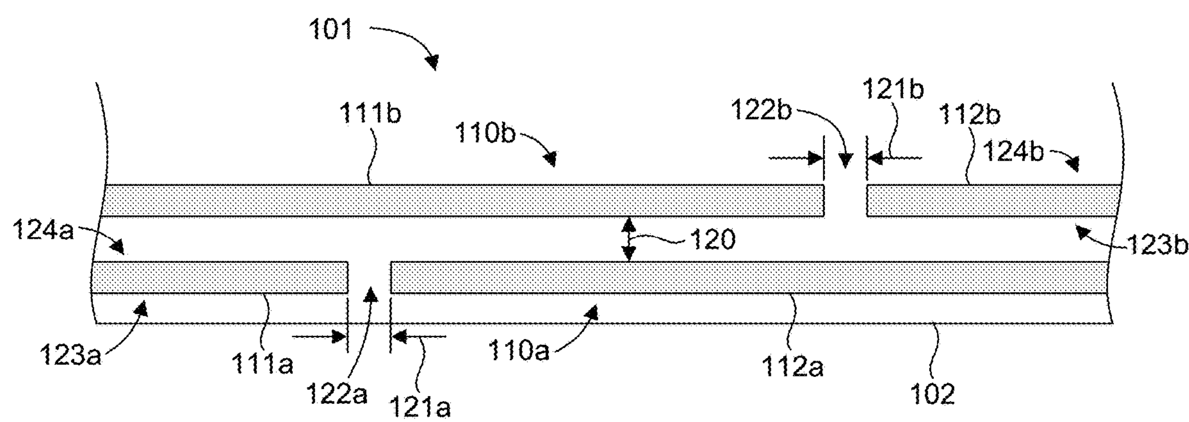
FIG. 2 illustrates a detailed view of a guard ring of the electronic component of FIG. 1.

With continued reference to FIG. 1, FIG. 2 illustrates a detail view of a portion 104 of the electronic component 100 of FIG. 1. The guard ring 101 can include a barrier formed in the semiconductor material 102, which can be disposed about or encompassing a perimeter of the electronic component 100, as illustrated. In one aspect, shown in FIG. 1, the guard ring 101 can include multiple barriers 110*a*, 110*b*. The barriers 110*a*, 110*b* can be spaced from one another by any suitable distance 120 to form multiple rows of barriers. The barriers 110*a*, 110*b* can be made of any suitable material, such as tungsten, aluminum, copper, silicon, titanium, titanium nitride, ruthenium, cobalt, tantalum, tantalum nitride, etc.

In one aspect, the barrier can have barrier portions oriented end to end. For example, the barrier 110*a* can have barrier portions 111*a*, 112*a* oriented end to end, and the barrier 110*b* can have barrier portions 111*b*, 112*b* oriented end to end. The guard ring 101 can also include an opening in the barrier between the barrier portions. For example, the barrier portions 111*a*, 112*a* can be separated from one another by a gap 121*a* to form an opening 122*a* between the barrier portions 111*a*, 112*a*. The barrier portions 111*b*, 112*b* can be separated from one another by a gap 121*b* to form an opening 122*b* between the barrier portions 111*b*, 112*b*. The opening 122*a* can extend between an outer side 123*a* and an inner side 124*a* (e.g., opposite sides) of the barrier 110*a*, such that a portion of the semiconductor material 102 extends between the outer and inner sides 123*a*, 124*a* of the barrier 110*a*. The opening 122*b* can extend between an outer side 123*b* and an inner side 124*b* (e.g., opposite sides) of the barrier 110*b*, such that a portion of the semiconductor material 102 extends between the outer and inner sides 123*b*, 124*b* of the barrier 110*b*. Despite the presence of the openings 122*a*, 122*b* in the barriers 110*a*, 110*b*, the guard ring 101 can still provide mechanical benefits and serve as a contamination barrier. For example, the openings 122*a*, 122*b* can be staggered or laterally offset from one another to prevent crack propagation and provide a tortuous or long path for contaminants to pass through the barriers 110*a*, 110*b*. The barriers 110*a*, 110*b* can include any suitable number of barrier portions with openings in the barriers between adjacent barrier portions. For example, each of the barriers 110*a*, 110*b* can include three or more barrier portions disposed about the perimeter of the semiconductor material 102. Each of the barriers 110*a*, 110*b* includes four such barrier portions as shown in FIG. 1.

Figure 3:
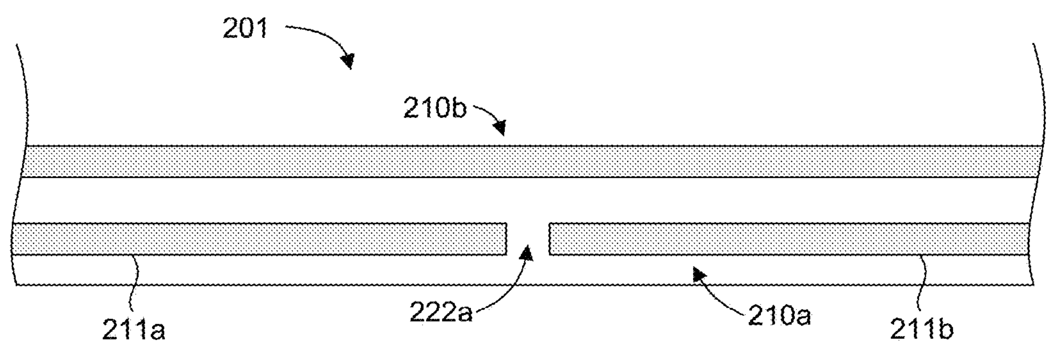
FIG. 3 illustrates a detailed view of a guard ring of an electronic component in accordance with an example.

FIG. 3 illustrates a detail view of a portion of an electronic component guard ring 201 in accordance with an example of the present disclosure. As with the guard ring 101 described above, the guard ring 201 includes multiple barriers 210*a*, 210*b* spaced from one another. The barrier 210*a* includes barrier portions 211*a*, 211*b* oriented end to end and separated by a gap to form an opening 222*a* in the barrier 210*a*. In this case, the barrier 210*b* is continuous and devoid of an opening. In other words, the barrier 210*b* does not include individual and distinct barrier portions but is, instead, one solid, continuous structure. In one aspect, the solid, continuous barrier 210*b* can be an innermost barrier in a multiple barrier arrangement or configuration or the outer most barrier.

Figure 4:
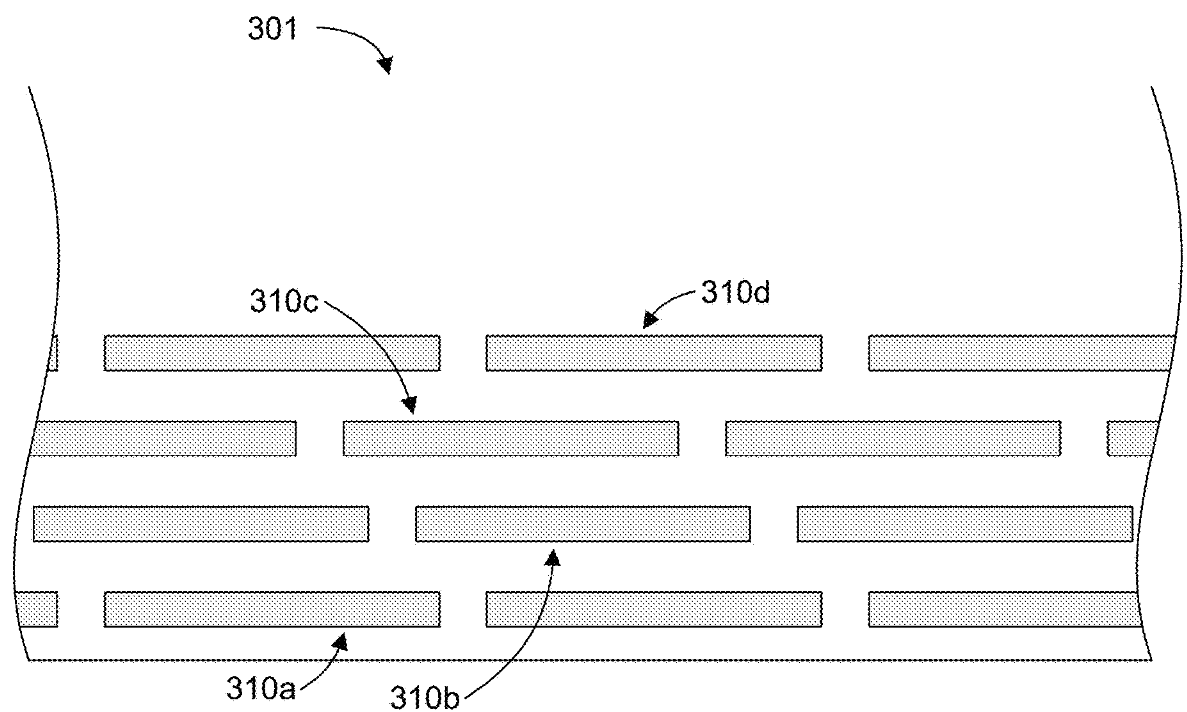
FIG. 4 illustrates a detailed view of a guard ring of an electronic component in accordance with an example.
Figure 5:
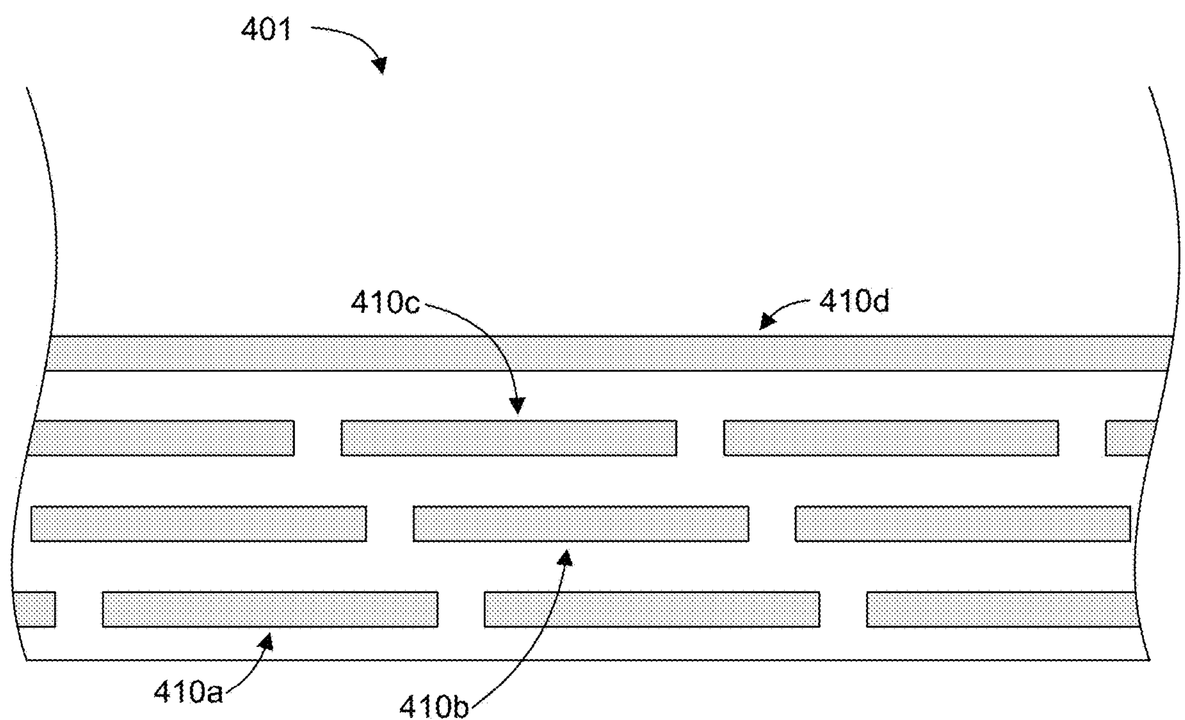
FIG. 5 illustrates a detailed view of a guard ring of an electronic component in accordance with an example.

It should be recognized that a guard ring in accordance with the present technology can include any suitable number of barriers or rows of barriers, such as three or more barriers. Two examples of multiple barrier configurations are illustrated in FIGS. 4 and 5. FIG. 4 illustrates a detail view of a portion of an electronic component guard ring 301 in accordance with another example of the present disclosure. In this case, the guard ring 301 includes four barriers 310*a-d*, with each barrier having multiple barrier portions oriented end to end and separated by gaps that form openings through the barriers. FIG. 5 illustrates a detail view of a portion of an electronic component guard ring 401 in accordance with another example of the present disclosure. In this case, the guard ring 401 includes four barriers 410*a-d*, with three of the barriers 410*a-c* having multiple barrier portions oriented end to end and separated by gaps that form openings through the barriers. The barrier 410*d* is continuous and devoid of an opening. In one aspect, the solid, continuous barrier 410*b* can be an innermost barrier in a multiple barrier arrangement or configuration. In another aspect, a multiple barrier arrangement or configuration can include only a single (i.e., no more than one) solid, continuous barrier and any suitable number of barriers with openings (e.g., three or more barriers with openings).

Figure 6:
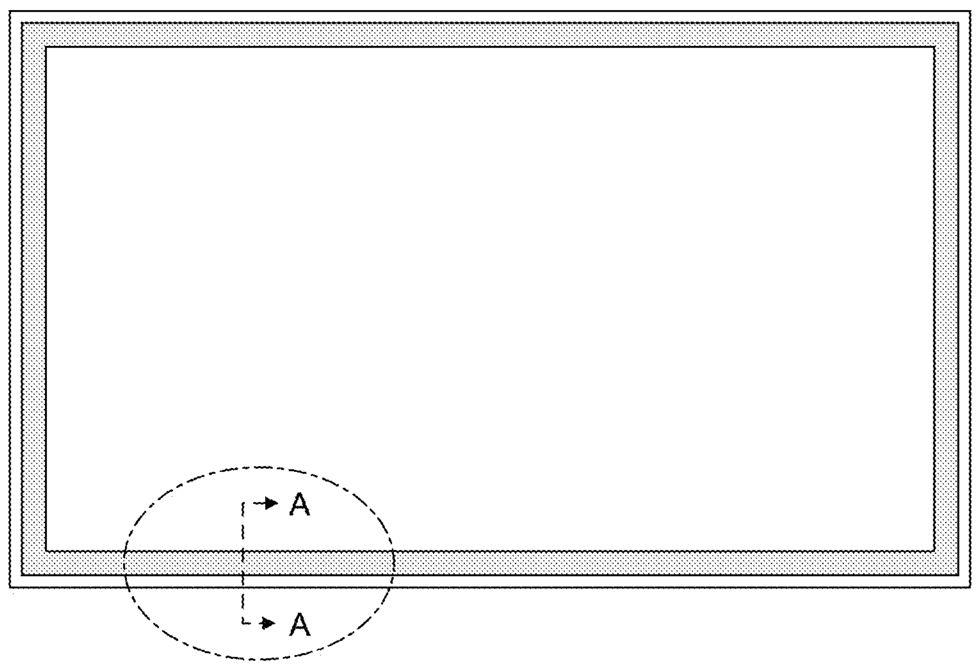
FIG. 6 illustrates a schematic representation of an electronic component in accordance with an example.
Figure 7:
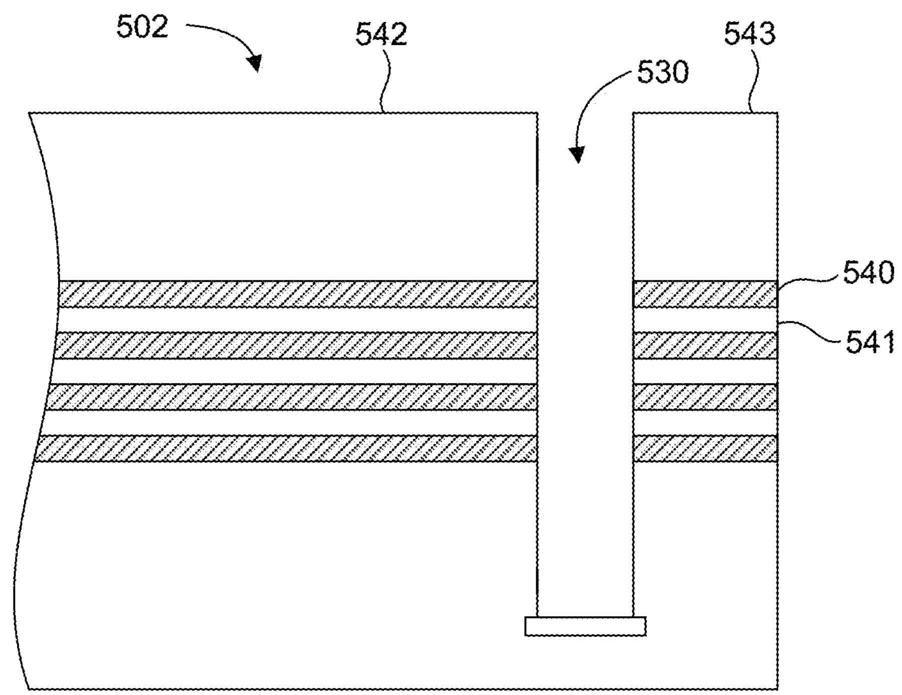
FIG. 7 illustrates a side cross-sectional view of a trench for making a guard ring of the electronic component of FIG. 6.

Manufacture of a guard ring as disclosed herein will be introduced in the context of a typical guard ring in a semiconductor material, a top view of which is shown in FIG. 6. A typical guard ring is represented as only a single, continuous barrier. Such a barrier is formed in a trench 530 in a semiconductor material 502, which is illustrated in cross section in FIG. 7. In some embodiments, the semiconductor material 502 includes a conductive material 540 and a dielectric material 541, which can be arranged in alternating conductive and dielectric layers, such as in a NAND flash memory component (e.g., conductive layers forming word lines in a 3D NAND device). Conductive layers can include any suitable conductive material, such as polycrystalline silicon, which can be conductively doped (e.g., to an N+ type conductivity). Dielectric layers can include any suitable dielectric material, such as an oxide (e.g., silicon oxide), an oxynitride (e.g., silicon oxynitride), etc.

The trench 530 can be formed by any suitable process or technique, such as a dry etch process. The trench 530 can effectively separate two portions of the semiconductor material 502 (e.g., an inner portion 542 and an outer portion 543), with portions of the conductive layers 540 in the outer portion 543 of the semiconductor material 502 that can become isolated (e.g., suspended by dielectric) by the formation of the trench 530. A dry etch process to form the trench 530 can include plasma, which involves electrons that can charge the conductive layers 540. Thus, the process to form the trench 530 can effectively form a capacitor with differential charge densities (e.g., charge per area) in the conductive layers 540 of the inner and outer portions 542, 543 of the semiconductor material 502. Utilizing a deep, long dry etch process to form the trench 530 can cause greater charge to build up in the conductive layers 540. As a result of the differential charge densities of the different portions of semiconductor material in the inner and outer portions 542 and 543, a significant potential difference is created and arcing can occur.

Figure 8:
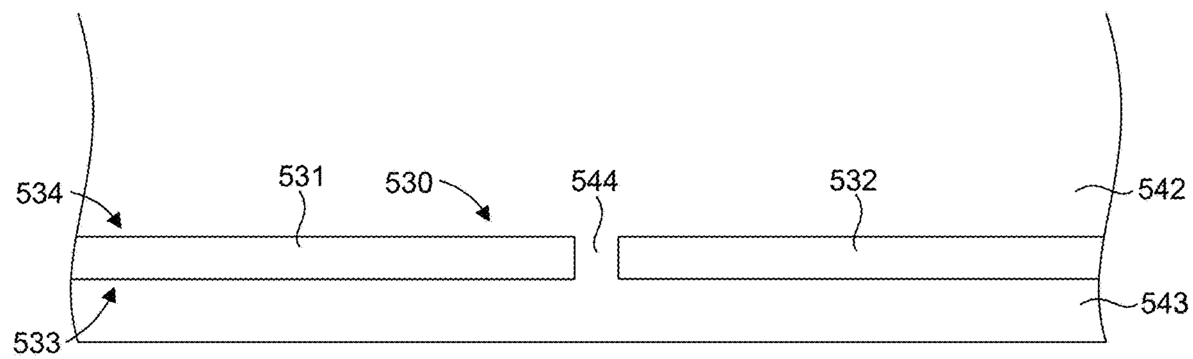
FIG. 8 illustrates a detailed view of a trench for making a guard ring of an electronic component in accordance with an example.

Such charge build-up in the conductive layers 540 can be mitigated by leaving a "jumper" or bridge 544 of semiconductor material between or connecting the inner and outer portions 542, 543 of the semiconductor material 502, as illustrated in FIG. 8. In other words, the trench 530 can be "broken" by the bridge 544, which can connect the relatively small portions of the conductive layers 540 in the outer portion 543 of the semiconductor material 502 to the relatively large portions of the conductive layers 540 in the inner portion 542 of the semiconductor material 502. Such localized connections or bridges of semiconductor material (i.e., conductive layers 540) can allow the charge to spread into a greater area, thus reducing the capacitive effect (i.e., reduce the charge per area) and the voltage across the trench 530, which can therefore reduce the likelihood of arcing. The bridge 544 can be of any suitable dimension to facilitate the dissipation of electron charge from the outer portion 543 of the semiconductor material into the inner portion 542. Forming the trench 530 such that the semiconductor material 502 is continuous via the bridge 544 (i.e., continuous conductive layers 540) results in an opening or gap in a barrier subsequently formed in the trench. Thus, the bridge 544 can define the opening or gap in a barrier of a guard ring.

In one aspect, a method for minimizing arcing when making an electronic component can include forming a trench portion 531 of the trench 530 in the semiconductor material 502, and forming a trench portion 532 of the trench 530 in the semiconductor material 502. The trench portion 531 and the trench portion 532 can be oriented end to end and separated from one another by a gap (i.e., the bridge 544) such that a portion of the semiconductor material 502 extends between a side 533 and a side 534 (e.g., opposite sides) of the trench 530. In some embodiments, a trench can include at least three trench portions separated by gaps or bridges. For example, a trench can include four or more breaks (i.e., bridges) in about 30 mm of linear distance in order to ensure adequate charge dissipation. The result of such measures to minimize arcing can provide an electronic component precursor that can include the semiconductor material 502, and the trench 530 having the trench portions 531, 532 formed in the semiconductor material for constructing a barrier to block ion diffusion and crack propagation in the electronic component. Additionally, a method for making an electronic component guard ring can include disposing a barrier material in the trench 530 to form a barrier portion in the trench portion 531 and a barrier portion in the trench portion 532 to block ion diffusion and crack propagation in the electronic component. The gap (i.e., the bridge 544) can form an opening in the barrier between the barrier portions. The barrier material can be disposed in the trench by any suitable process or technique, such as a deposition process.

While a single barrier configuration with a gap or opening formed by the bridge 544 may effectively dissipate built-up electrical charge in the conductive layers 540, such a configuration may be inadequate for providing the desired functions of a guard ring, such as preventing crack propagation and providing a contamination barrier. As a result, multiple barrier configurations can be utilized, such as those illustrated in FIGS. 1-5.

Figure 9:
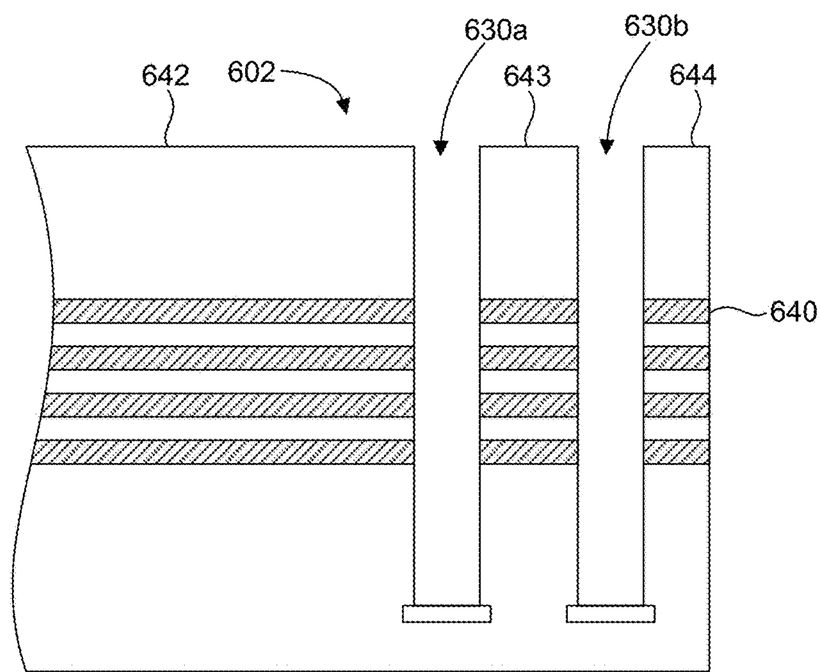
FIG. 9 illustrates a side view of trenches for making a guard ring of an electronic component in accordance with an example.

FIG. 9 illustrates a cross-section of a semiconductor material 602 and trenches 630*a*, 630*b* in a two-barrier configuration as in FIGS. 1-3. The formation of trenches to create multiple barriers or rows of barriers can potentially isolate multiple portions of conductive layers 640. For example, the trenches 630*a*, 630*b* can isolate outer portions 643, 644 from one another and the larger inner semiconductor material portion 642. Thus, trenches that form multiple barriers can have bridges to connect semiconductor material portions that would otherwise be isolated. The result is the formation of openings in barriers (e.g., openings 122*a*, 122*b* in barriers 110*a*, 110*b* of FIG. 2).

In one aspect, one or more trenches can be continuous with no bridge interrupting the trench (i.e., devoid of a gap or bridge interrupting the trench). For example, the trench formed to create the barrier 210*b* of FIG. 3 is continuous with no interruptions. Such a trench and barrier configuration can be utilized when built-up charge can be adequately dissipated by bridges or connections through one or more other trenches, such as a bridge forming the opening 222*a* in the barrier 210*a*. A continuous barrier can provide enhanced protection capabilities over a divided or discontinuous barrier. Typically, the greater the number of semiconductor material portions interconnected by bridges, the greater the ability to dissipate built-up charge due to the increased area of interconnected semiconductor material. Thus, a continuous, unbroken trench may be an innermost or outermost trench separating or isolating an inner semiconductor material portion from multiple outer semiconductor material portions. The outer semiconductor material portions can be connected to one another via a bridge in one or more outer trenches to accommodate the charge build-up in the combined areas of the outer semiconductor material portions, as in FIGS. 3 and 5. In some embodiments, a continuous, unbroken trench may be located anywhere (e.g., in a middle region) among multiple rows of trenches separating or isolating semiconductor material portions from one another, provided that connected semiconductor portions can accommodate the charge build-up in the combined areas of the grouped semiconductor material portions. Thus, some embodiments can include multiple continuous, unbroken trenches (e.g., an innermost trench, a middle trench, and/or an outermost trench in any combination) among rows of trenches in multiple semiconductor material portions.

Figure 10:
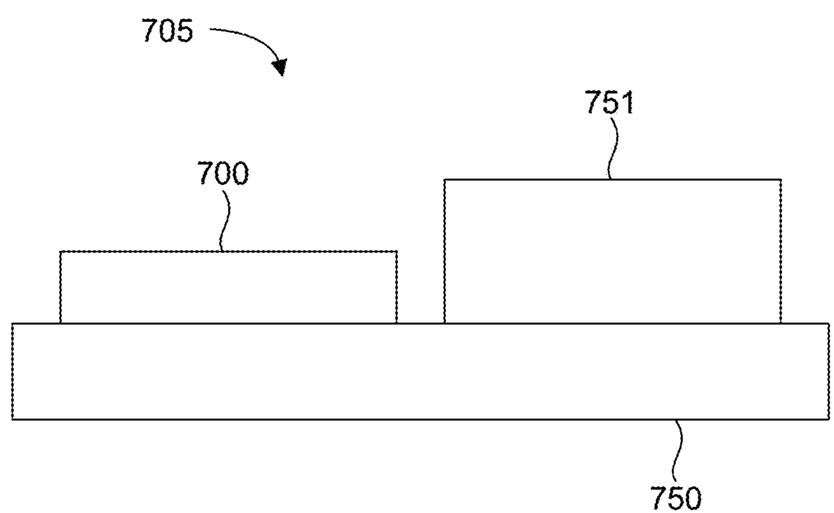
FIG. 10 is a schematic illustration of a side view of an electronic device in accordance with an example.

FIG. 10 is a schematic representation of an electronic device 705 in accordance with an example of the present disclosure. The electronic device can include a device substrate 750 and an electronic component 700 as disclosed herein operably coupled to the device substrate 750. In one embodiment, the electronic component can comprise a memory component, such as a solid state computer memory component (e.g., a NAND flash device). In one aspect, the device 705 can include any suitable electronic component 751, such as a CPU, a GPU, a memory controller, a video decoder, an audio decoder, a video encoder, a camera processor, system memory, and/or a modem.

Figure 11:
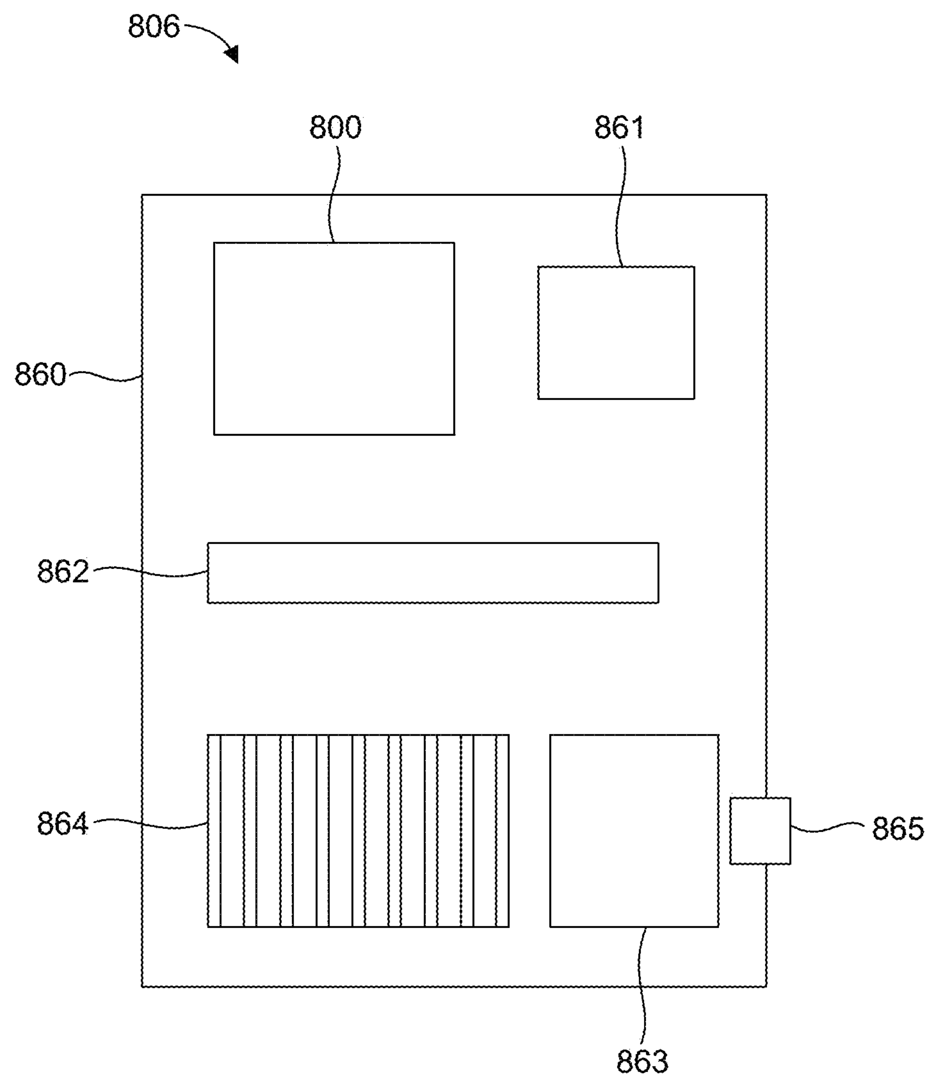
FIG. 11 is a schematic illustration of an exemplary computing system.

FIG. 11 illustrates an example computing system 806. The computing system 806 can include an electronic component 800 as disclosed herein, coupled to a motherboard 860. In one aspect, the computing system 806 can also include a processor 861, a memory device 862, a radio 863, a heat sink 864, a port 865, a slot, or any other suitable device or component, which can be operably coupled to the motherboard 860. The computing system 806 can comprise any type of computing system, such as a desktop computer, a laptop computer, a tablet computer, a smartphone, a wearable device, a server, etc. Other embodiments need not include all of the features specified in FIG. 11, and may include alternative features not specified in FIG. 11.

EXAMPLES

The following examples pertain to further embodiments.

In one example there is provided, an electronic component guard ring comprising a barrier having a first barrier portion and a second barrier portion oriented end to end to block ion diffusion and crack propagation in an electronic component, and an opening in the barrier between the first and second barrier portions extending between a first side and a second side of the barrier.

In one example of an electronic component guard ring, the first barrier portion and the second barrier portion are separated from one another by a gap to form the opening.

In one example of an electronic component guard ring, the barrier comprises at least three barrier portions and the opening comprises a plurality of openings in the barrier between adjacent barrier portions.

In one example of an electronic component guard ring, the barrier comprises a plurality of barriers spaced from one another on at least one of the first side and the second side.

In one example of an electronic component guard ring, the plurality of barriers comprises at least three barriers.

In one example, an electronic component guard ring comprises a second barrier spaced from the first barrier on the first side or the second side, wherein the second barrier is continuous and devoid of an opening.

In one example of an electronic component guard ring, the first barrier comprises a plurality of barriers spaced from one another on at least one of the first side and the second side.

In one example of an electronic component guard ring, the second barrier is an innermost barrier.

In one example of an electronic component guard ring, the barrier is disposed about a perimeter of the electronic component.

In one example of an electronic component guard ring, the barrier comprises tungsten.

In one example, there is provided an electronic component precursor comprising a semiconductor material forming a portion of an electronic component, and a trench having a first trench portion and a second trench portion formed in the semiconductor material for constructing a barrier to block ion diffusion and crack propagation in the electronic component, wherein the first and second trench portions are oriented end to end and separated from one another by a gap such that a portion of the semiconductor material extends between a first side and a second side of the trench.

In one example of an electronic component precursor, the trench comprises at least three trench portions separated by gaps between adjacent trench portions.

In one example of an electronic component precursor, the trench comprises a plurality of trenches spaced from one another on at least one of the first side and the second side.

In one example of an electronic component precursor, the plurality of trenches comprises at least three trenches.

In one example, an electronic component precursor comprises a second trench spaced from the first trench on the first side or the second side, wherein the second trench is continuous and devoid of a gap.

In one example of an electronic component precursor, the first trench comprises a plurality of trenches spaced from one another on at least one of the first side and the second side.

In one example of an electronic component precursor, the second trench is an innermost trench.

In one example of an electronic component precursor, the trench is disposed about a perimeter of the electronic component.

In one example of an electronic component precursor, the semiconductor material comprises polycrystalline silicon.

In one example of an electronic component precursor, the semiconductor material comprises a plurality of polycrystalline silicon layers.

In one example, an electronic component precursor comprises a plurality of oxide layers alternatingly arranged with the plurality of polycrystalline silicon layers.

In one example there is provided, an electronic component comprising a semiconductor material, a barrier formed in the semiconductor material, the barrier having a first barrier portion and a second barrier portion oriented end to end to block ion diffusion and crack propagation in the electronic component, and an opening in the barrier between the first and second barrier portions such that a portion of the semiconductor material extends between a first side and a second side of the barrier.

In one example of an electronic component, the first barrier portion and the second barrier portion are separated from one another by a gap to form the opening.

In one example of an electronic component, the barrier comprises at least three barrier portions and the opening comprises a plurality of openings in the barrier between adjacent barrier portions.

In one example of an electronic component, the barrier comprises a plurality of barriers spaced from one another on at least one of the first side and the second side.

In one example of an electronic component, the plurality of barriers comprises at least three barriers.

In one example, an electronic component comprises a second barrier spaced from the first barrier on the first side or the second side, wherein the second barrier is continuous and devoid of an opening.

In one example of an electronic component, the first barrier comprises a plurality of barriers spaced from one another on at least one of the first side and the second side.

In one example of an electronic component, the second barrier is an innermost barrier.

In one example of an electronic component, the barrier is disposed about a perimeter of the electronic component.

In one example of an electronic component, the barrier comprises tungsten.

In one example of an electronic component, the semiconductor material comprises polycrystalline silicon.

In one example of an electronic component, the semiconductor material comprises a plurality of polycrystalline silicon layers.

In one example, an electronic component comprises a plurality of oxide layers alternatingly arranged with the plurality of polycrystalline silicon layers.

In one example there is provided, an electronic device comprising a semiconductor material, an electronic component operably coupled to the semiconductor material, the electronic component comprises a semiconductor material, a barrier formed in the semiconductor material, the barrier having a first barrier portion and a second barrier portion oriented end to end to block ion diffusion and crack propagation in the electronic component, and an opening in the barrier between the first and second barrier portions such that a portion of the semiconductor material extends between a first side and a second side of the barrier.

In one example of an electronic device, the electronic component comprises a memory component.

In one example, an electronic device comprises a CPU, a GPU, a memory controller, a video decoder, an audio decoder, a video encoder, a camera processor, system memory, a modem, or a combination thereof.

In one example, there is provided a computing system comprising a motherboard, and an electronic device component operably coupled to the motherboard, the electronic component comprises a semiconductor material, a barrier formed in the semiconductor material, the barrier having a first barrier portion and a second barrier portion oriented end to end to block ion diffusion and crack propagation in the electronic component, and an opening in the barrier between the first and second barrier portions such that a portion of the semiconductor material extends between a first side and a second side of the barrier.

In one example of a computing system, the computing system comprises a desktop computer, a laptop, a tablet, a smartphone, a wearable device, a server, an integrated automotive computing system (automated driver assistance system) or a combination thereof.

In one example of a computing system, the computing system further comprises a processor, a memory device, a heat sink, a radio, a slot, a port, or a combination thereof operably coupled to the motherboard.

In one example there is provided a method for making an electronic component guard ring comprising forming a trench in a semiconductor material of an electronic component, the trench having a first trench portion and a second trench portion oriented end to end and separated from one another by a gap such that a portion of the semiconductor material extends between a first side and a second side of the trench, and disposing a barrier material in the trench to form a first barrier portion and a second barrier portion in the first trench portion and the second trench portion, respectively, to block ion diffusion and crack propagation in the electronic component, wherein the gap forms an opening in the barrier between the first and second barrier portions.

In one example of a method for making an electronic component guard ring, forming a trench comprises a dry etching process.

In one example of a method for making an electronic component guard ring, disposing a barrier material in the trench comprises a deposition process.

In one example of a method for making an electronic component guard ring, forming the trench comprises forming at least three trench portions with gaps in the trench between adjacent trench portions.

In one example of a method for making an electronic component guard ring, the trench comprises a plurality of trenches spaced from one another on at least one of the first side and the second side.

In one example, a method for making an electronic component guard ring comprises a second trench spaced from the first trench on the first side or the second side, wherein the second trench is continuous and devoid of a gap.

In one example of a method for making an electronic component guard ring, the first trench comprises a plurality of trenches spaced from one another on at least one of the first side and the second side.

In one example of a method for making an electronic component guard ring, the plurality of trenches comprises at least three trenches.

In one example of a method for making an electronic component guard ring, the second trench is an innermost trench.

In one example of a method for making an electronic component guard ring, the trench is disposed about a perimeter of the electronic component.

In one example of a method for making an electronic component guard ring, the barrier material comprises tungsten.

In one example of a method for making an electronic component guard ring, the semiconductor material comprises polycrystalline silicon.

In one example of a method for making an electronic component guard ring, the semiconductor material comprises a plurality of polycrystalline silicon layers.

In one example of a method for making an electronic component guard ring, the plurality of polycrystalline silicon layers are alternatingly arranged with a plurality of oxide layers.

In one example there is provided a method for minimizing arcing when making an electronic component comprising forming a first trench portion of a trench in a semiconductor material of an electronic component, and forming a second trench portion of the trench in the semiconductor material, wherein the first trench portion and the second trench portion are oriented end to end and separated from one another by a gap such that a portion of the semiconductor material extends between a first side and a second side of the trench.

In one example of a method for minimizing arcing when making an electronic component, forming the first and second trench portions comprises a dry etching process.

In one example, a method for minimizing arcing when making an electronic component comprises forming at least three trench portions of the trench with gaps in the trench between adjacent trench portions.

In one example of a method for minimizing arcing when making an electronic component, the trench comprises a plurality of trenches spaced from one another on at least one of the first side and the second side.

In one example of a method for minimizing arcing when making an electronic component, the plurality of trenches comprises at least three trenches.

In one example, a method for minimizing arcing when making an electronic component comprises a second trench spaced from the first trench on the first side or the second side, wherein the second trench is continuous and devoid of a gap.

In one example of a method for minimizing arcing when making an electronic component, the first trench comprises a plurality of trenches spaced from one another on at least one of the first side and the second side.

In one example of a method for minimizing arcing when making an electronic component, the second trench is an innermost trench.

In one example of a method for minimizing arcing when making an electronic component, the trench is disposed about a perimeter of the electronic component.

In one example of a method for minimizing arcing when making an electronic component, the semiconductor material comprises polycrystalline silicon.

In one example of a method for minimizing arcing when making an electronic component, the semiconductor material comprises a plurality of polycrystalline silicon layers.

In one example of a method for minimizing arcing when making an electronic component, the plurality of polycrystalline silicon layers are alternatingly arranged with a plurality of oxide layers.

Circuitry used in electronic components or devices (e.g. a die) of an electronic device can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device comprising:
an electronic component; and
a first barrier disposed about a perimeter of the electronic component and extending through layers of conductive material and layers of insulative material,
the first barrier including multiple barrier portions including gaps between adjacent barrier portions, each of the gaps between adjacent barrier portions including a bridge of material between a semiconductor material on a first side of the first barrier and a semiconductor material on a second side of the first barrier; and
a second barrier around the first barrier, the second barrier including a continuous barrier.

2. The electronic device of claim 1, wherein:
the multiple barrier portions include at least three barrier portions.

3. The electronic device of claim 1, wherein:
the multiple barrier portions include four barrier portions.

4. The electronic device of claim 1, wherein the first barrier comprises a plurality of barriers spaced from one another on at least one of the first side and the second side.

5. The electronic device of claim 1, wherein:
the second barrier comprises an outermost barrier.

6. The electronic device of claim 1, wherein:
the first barrier comprises an innermost barrier.

7. The electronic device of claim 1, further comprising:
a third barrier disposed about a perimeter of the electronic component.

8. The electronic device of claim 7, wherein:
the third barrier includes multiple third barrier portions including gaps between adjacent third barrier portions.

9. The electronic device of claim 8, wherein:
the gaps between the adjacent third barrier portions are laterally offset from the gaps between the barrier portions of the first barrier.

10. The electronic device of claim 7, further comprising:
a fourth barrier disposed about a perimeter of the electronic component.

11. The electronic device of claim 10, wherein:
the fourth barrier includes multiple fourth barrier portions including gaps between adjacent fourth barrier portions.

12. The electronic device of claim 1, wherein:
the first barrier includes one or more of: tungsten, aluminum, copper, silicon, titanium, titanium nitride, ruthenium, cobalt, tantalum, and tantalum nitride.

13. The electronic device of claim 1, wherein:
the bridge of material comprises a conductive material.

14. The electronic device of claim 1, wherein:
the electronic component includes one or more of: a CPU (central processing unit), a GPU (graphics processing unit), a memory controller, a video decoder, an audio decoder, a video encoder, a camera processor, system memory, and a modem.

15. A system comprising:
a motherboard; and
an electronic device coupled with the motherboard, the electronic device comprising:
a first barrier disposed about a perimeter of an electronic component and extending through layers of conductive material and layers of insulative material,
the first barrier including multiple barrier portions including gaps between adjacent barrier portions, each of the gaps between adjacent barrier portions including a bridge of material between a semiconductor material on one side of the first barrier and a semiconductor material on a second side of the first barrier; and
a second barrier around the first barrier, the second barrier including a continuous barrier.

16. The system of claim 15, wherein:
the electronic component includes one or more of: a CPU (central processing unit), a GPU (graphics processing unit), a memory controller, a video decoder, an audio decoder, a video encoder, a camera processor, a memory device, a NAND flash device, and a modem.

17. The system of claim 15, further comprising:
one or more of: a processor, a memory device, a radio, a heat sink, and a port.

18. An electronic component guard ring comprising:
a first barrier disposed about a perimeter of an electronic component and extending through layers of conductive material and layers of insulative material,
the first barrier including multiple barrier portions including gaps between adjacent barrier portions, each of the gaps between adjacent barrier portions including a bridge of material between a semiconductor material on one side of the first barrier and a semiconductor material on a second side of the first barrier; and
a second barrier around the first barrier, the second barrier including a continuous barrier.

19. The electronic component guard ring of claim 18, wherein:
the multiple barrier portions include at least three barrier portions.

20. The electronic component guard ring of claim 18, wherein:
the multiple barrier portions include four barrier portions.

* * * * *